United States Patent
Yang et al.

(10) Patent No.: US 9,508,734 B2
(45) Date of Patent: Nov. 29, 2016

(54) SONOS DEVICE

(71) Applicant: UNITED MICROELECTRONICS CORP., Hsin-Chu (TW)

(72) Inventors: Chin-Sheng Yang, Hsinchu (TW); Chien-Hung Chen, Hsin-Chu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/077,892

(22) Filed: Mar. 22, 2016

(65) Prior Publication Data
US 2016/0204121 A1 Jul. 14, 2016

Related U.S. Application Data

(62) Division of application No. 13/914,641, filed on Jun. 11, 2013, now Pat. No. 9,331,184.

(51) Int. Cl.
| | |
|---|---|
| *H01L 29/792* | (2006.01) |
| *H01L 27/115* | (2006.01) |
| *H01L 29/66* | (2006.01) |
| *H01L 29/423* | (2006.01) |
| *H01L 21/28* | (2006.01) |

(52) U.S. Cl.
CPC ... *H01L 27/11568* (2013.01); *H01L 21/28282* (2013.01); *H01L 29/4234* (2013.01); *H01L 29/66833* (2013.01); *H01L 29/792* (2013.01)

(58) Field of Classification Search
CPC .................. H01L 21/28282; H01L 27/11568; H01L 29/792; H01L 29/4234; H01L 29/66833
See application file for complete search history.

(56) References Cited

U.S. PATENT DOCUMENTS

| | | | |
|---|---|---|---|
| 4,151,537 | A | 4/1979 | Goldman |
| 4,257,832 | A | 3/1981 | Schwabe |
| 4,342,099 | A | 7/1982 | Kuo |
| 4,438,157 | A | 3/1984 | Romano-Moran |
| 4,654,828 | A | 3/1987 | Hagiwara |
| 4,870,470 | A | 9/1989 | Bass, Jr. |
| 5,286,994 | A | 2/1994 | Ozawa |
| 5,407,870 | A | 4/1995 | Okada |
| 5,436,481 | A | 7/1995 | Egawa |
| 5,700,728 | A | 12/1997 | Kuo |
| 6,677,213 | B1 | 1/2004 | Ramkumar |
| 6,709,928 | B1 | 3/2004 | Jenne |
| 6,818,558 | B1 | 11/2004 | Rathor |
| 7,670,963 | B2 | 3/2010 | Ramkumar |
| 7,799,670 | B2 | 9/2010 | Ramkumar |
| 7,898,852 | B1 | 3/2011 | Levy |
| 8,063,434 | B1 | 11/2011 | Polishchuk |
| 8,088,683 | B2 | 1/2012 | Ramkumar |
| 8,163,660 | B2 | 4/2012 | Puchner |
| 8,222,111 | B1 | 7/2012 | Hwang |

(Continued)

FOREIGN PATENT DOCUMENTS

| | | |
|---|---|---|
| EP | 0096062 | 6/1986 |
| TW | 230601 | 9/1994 |
| TW | 231373 | 10/1994 |

*Primary Examiner* — Fazli Erdem
(74) *Attorney, Agent, or Firm* — Winston Hsu; Scott Margo

(57) ABSTRACT

A silicon-oxide-nitride-oxide-silicon (SONOS) device is disclosed. The SONOS device includes a substrate; a first oxide layer on the substrate; a silicon-rich trapping layer on the first oxide layer; a nitrogen-containing layer on the silicon-rich trapping layer; a silicon-rich oxide layer on the nitrogen-containing layer; and a polysilicon layer on the silicon-rich oxide layer.

8 Claims, 1 Drawing Sheet

(56) References Cited

U.S. PATENT DOCUMENTS

| | | |
|---|---|---|
| 8,222,688 B1 | 7/2012 | Jenne |
| 8,283,261 B2 | 10/2012 | Ramkumar |
| 8,643,124 B2 | 2/2014 | Levy |
| 2002/0063277 A1* | 5/2002 | Ramsbey .............. H01L 27/105 257/316 |
| 2005/0122783 A1 | 6/2005 | Kim |
| 2006/0246661 A1* | 11/2006 | Joo ....................... C23C 16/042 438/257 |
| 2007/0045711 A1 | 3/2007 | Bhattacharyya |
| 2007/0048957 A1 | 3/2007 | Lee |
| 2007/0066083 A1* | 3/2007 | Yang ..................... B82Y 10/00 438/764 |
| 2008/0090354 A1 | 4/2008 | Baek |
| 2008/0230830 A1 | 9/2008 | Kim |
| 2008/0272424 A1* | 11/2008 | Kim ................. H01L 21/28282 257/321 |
| 2008/0290400 A1 | 11/2008 | Jenne |
| 2009/0008702 A1 | 1/2009 | Ramaswamy |
| 2009/0032863 A1 | 2/2009 | Levy |
| 2009/0175089 A1* | 7/2009 | Eitan .................. G11C 16/0475 365/185.28 |
| 2009/0179253 A1 | 7/2009 | Levy |
| 2009/0242962 A1 | 10/2009 | Ramkumar |
| 2009/0243001 A1 | 10/2009 | Ramkumar |
| 2010/0041222 A1 | 2/2010 | Puchner |
| 2011/0075486 A1 | 3/2011 | Liao |
| 2011/0101442 A1 | 5/2011 | Ganguly |
| 2011/0248332 A1 | 10/2011 | Levy |
| 2013/0181279 A1 | 7/2013 | Tian |
| 2013/0307053 A1 | 11/2013 | Polishchuk |

* cited by examiner

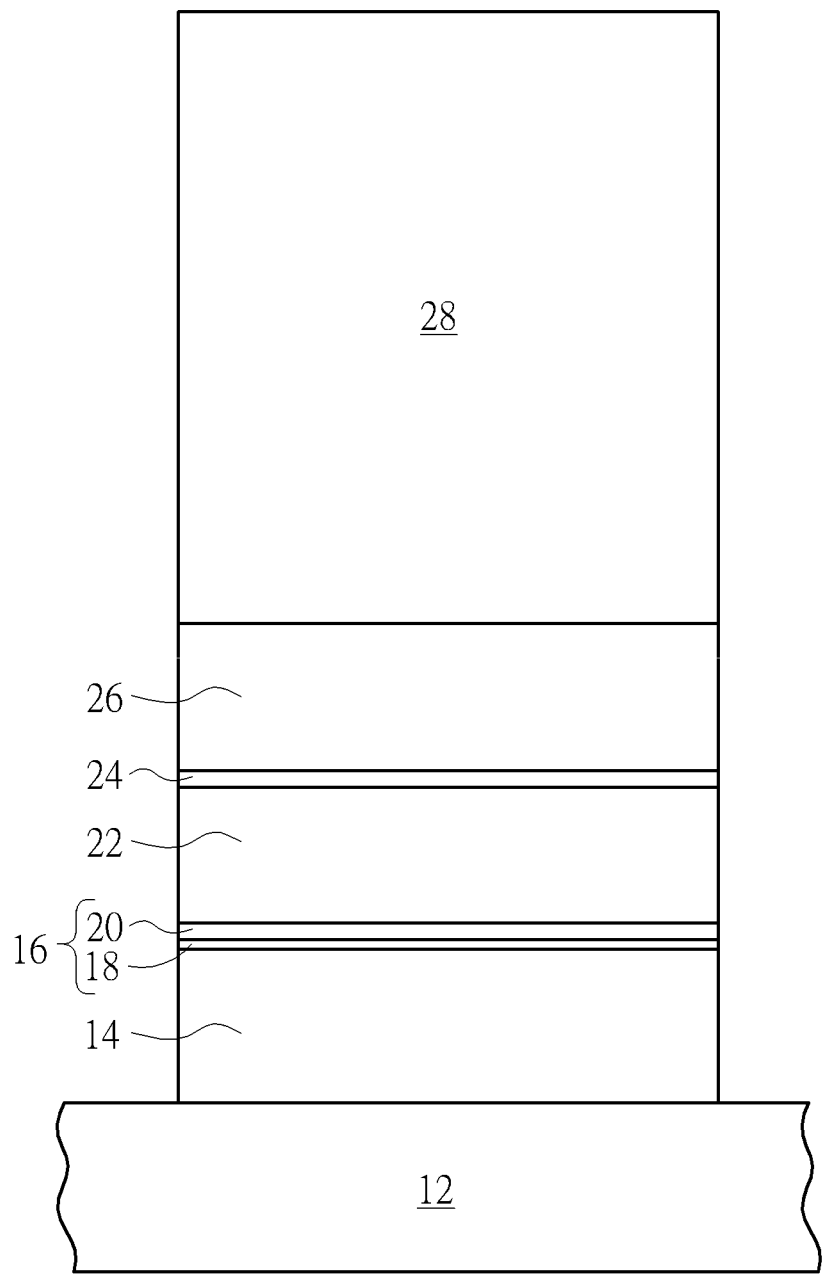

SONOS DEVICE

CROSS REFERENCE TO RELATED APPLICATIONS

This application is a division of U.S. application Ser. No. 13/914,641 filed Jun. 11, 2013, and incorporated herein by reference in its entirety.

BACKGROUND OF THE INVENTION

1. Field of the Invention

The invention relates to a silicon-oxide-nitride-oxide-silicon (SONOS) device.

2. Description of the Prior Art

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased electrically.

Product development efforts in memory device technology have focused on increasing the programming speed, lowering programming and reading voltages, increasing data retention time, reducing cell erasure times and reducing cell dimensions. Some of the flash memory arrays today utilize a gate structure made of dual polysilicon layers (also refers to as the dual poly-Si gate). The polysilicon layer utilized in these gate structures often includes a dielectric material composed of an oxide-nitride-oxide (ONO) structure. When the device is operating, electrons are injected from the substrate into the bottom layer of the dual polysilicon layers for storing data. Since these dual gate arrays typically store only one single bit of data, they are inefficient for increasing the capacity of the memory. As a result, a flash memory made of silicon-oxide-nitride-oxide-silicon (SONOS) is derived. Preferably, a transistor from these memories is capable of storing two bits of data simultaneously, which not only reduces the size of the device but also increases the capacity of the memory significantly. The operation of a typical SONOS memory is described below.

During the programming of a typical SONOS memory, electrical charge is transferred from a substrate to the charge storage layer in the device, such as the nitride layer in the SONOS memory. Voltages are applied to the gate and drain creating vertical and lateral electric fields, which accelerate the electrons along the length of the channel. As the electrons move along the channel, some of them gain sufficient energy to become trapped in the charge storage dielectric material. This jump is known as hot carrier injection, in which the hot carriers being the electrons. Charges are trapped near the drain region as the electric fields are strongest near the drain. Reversing the potentials applied to the source and drain will cause electrons to travel along the channel in the opposite direction and be injected into the charge storage dielectric layer near the source region. Since part of the charge storage dielectric layer are electrically conductive, the charged introduced into these parts of the charge storage dielectric material tend to remain localized. Accordingly, depending upon the application of voltage potentials, electrical charge can be stored in discrete regions within a single continuous charge storage dielectric layer.

However, the ability for trapping and retaining electrical charges under current SONOS architecture is still not perfect, including shortcomings such as insufficient trapping sites for charges as well as easy leakage. Hence how to effective improve the current SONOS architecture to increase the overall performance of the device has become an important task in this field.

SUMMARY OF THE INVENTION

According to a preferred embodiment of the present invention, a silicon-oxide-nitride-oxide-silicon (SONOS) device is disclosed. The SONOS device includes a substrate; a first oxide layer on the substrate; a silicon-rich trapping layer on the first oxide layer; a nitrogen-containing layer on the silicon-rich trapping layer; a silicon-rich oxide layer on the nitrogen-containing layer; and a polysilicon layer on the silicon-rich oxide layer.

According to another aspect of the present invention, a method for fabricating silicon-oxide-nitride-oxide-silicon (SONOS) device is disclosed. The method includes: providing a substrate; forming a first oxide layer on the substrate; forming a silicon nitride (SiN) layer on the first oxide layer; performing a first silane soak process; injecting ammonia and silane for forming a silicon-rich trapping layer on the silicon nitride layer; forming a nitrogen-containing layer on the silicon-rich trapping layer; forming a silicon-rich oxide layer on the nitrogen-containing layer; and forming a polysilicon layer on the silicon-rich oxide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The FIGURE illustrates a method for fabricating a SONOS device according to a preferred embodiment of the present invention.

DETAILED DESCRIPTION

The FIGURE illustrates a method for fabricating a SONOS device according to a preferred embodiment of the present invention. As shown in the FIGURE, a substrate 12, such as a semiconductor substrate composed of gallium arsenide (GaAs), silicon on insulator (SOI) layer, epitaxial layer, silicon germanium layer, or other semiconductor materials is provided. A tunnel oxide, such as an oxide layer 14 is formed on the substrate 12, and a silicon-rich trapping layer 16 is formed on the oxide layer 14 thereafter.

According to a preferred embodiment of the present invention, the silicon-rich trapping layer 16 could include a silicon nitride layer 18 and a silicon-rich layer 20, such as a silicon-rich SiN layer or a silicon-rich SiON layer. In other words, the silicon-rich trapping layer 16 could include a composite layer consisting of a silicon nitride layer 18 and a silicon-rich SiN layer, or a composite layer consisting of a silicon nitride layer 18 and a silicon-rich SiON layer.

According to a preferred embodiment of the present invention, if a composite layer of a silicon nitride layer 18 and a silicon-rich SiN layer were to be formed, an ammonia soak process could be first performed on the oxide layer 14, and then ammonia and silane are injected with a microwave-plasma enhanced chemical vapor deposition (PECVD) process to form a silicon nitride layer 18 on the oxide layer 14.

The ammonia soak forms a nitride rich interface monolayer between the silicon nitride layer 18 and the oxide layer 14. Next, a silane soak is carried out under plasma off on the silicon nitride layer 18, and then ammonia and silane are injected with plasma on to form a silicon-rich layer 20 consisting of silicon-rich SiN layer. This forms a silicon-rich trapping layer 16 consisting of a silicon nitride layer 18 and a silicon-rich SiN layer.

Alternatively, if a composite layer of a silicon nitride layer 18 and a silicon-rich SiON layer were to be formed, an ammonia soak process could also be first carried out on the oxide layer 14, and then ammonia and silane are injected with a microwave PECVD process to forma silicon nitride layer 18 on the oxide layer 14. The ammonia soak forms a nitride rich interface monolayer between the silicon nitride layer 18 and the oxide layer 14. Next, a silane soak is performed under plasma off environment on the silicon nitride layer 18, and then ammonia, oxygen, and silane are injected with plasma on to form a silicon-rich layer 20 consisting of a silicon-rich SiON layer. This forms a silicon-rich trapping layer 16 consisting of a silicon nitride layer 18 and a silicon-rich SiON layer.

Preferably, the thickness of the silicon nitride layer 18 is less than 10 Angstroms, and the thickness of the silicon-rich layer 20, including silicon-rich SiN layer or silicon-rich SiON layer is less than 15 Angstroms, but not limited thereto.

According to an embodiment of the present invention, a selective helium (He) pre-clean process could be carried out before or during the silane soaking which was conducted to form the silicon-rich trapping layer, in which the temperature of the helium pre-clean is preferably greater than 300° C. In addition, the silane soak could be performed under atmospheric or sub-atmospheric environment in the same chamber tool, which is also within the scope of the present invention.

Next, a nitrogen-containing layer 22 is formed on the silicon-rich trapping layer 16, in which the nitrogen-containing layer 22 could include a silicon nitride layer or a silicon oxynitride layer. Similar to the aforementioned method for fabricating the silicon-rich trapping layer 16, if a nitrogen-containing layer being composed of a silicon nitride layer were to be formed, ammonia and silane could be injected directly to form a silicon nitride layer. Alternatively, if a nitrogen-containing layer being composed of a silicon oxynitride layer were to be formed, ammonia, oxygen, and silane could be injected directly to forma silicon oxynitride layer. Preferably, the thickness of the nitrogen-containing layer 22 is between 10-30 Angstroms, but not limited therein.

It should be noted that even the aforementioned silicon-rich trapping layer 16 includes two embodiments, such as a combination consisting of silicon nitride layer and silicon-rich SiN layer, or a combination consisting of silicon nitride layer and silicon-rich SiON layer, plus that the nitrogen-containing layer 22 also includes two material combinations including silicon nitride layer and silicon oxynitride layer, the silicon-rich trapping layer 16, if being composed of a silicon nitride layer and a silicon-rich SiN layer, the nitrogen-containing layer 22 is preferably composed of a silicon nitride layer. Conversely, if the silicon-rich trapping layer 16 is composed of a silicon nitride layer and a silicon-rich SiON layer, the nitrogen-containing layer 22 is preferably composed of a silicon oxynitride layer. Nevertheless, the material combinations of the silicon-rich trapping layer 16 and the nitrogen-containing layer 22 could be adjusted according to the demand of the product, and not limited thereto.

Next, a silane soak is performed under plasma off environment on the nitrogen-containing layer 22, and oxygen and silane are injected with plasma on to form a silicon-rich oxide layer 24 on the nitrogen-containing layer 22.

Another oxide layer 26 could be selectively formed on the silicon-rich oxide layer 24 thereafter, and then a control gate, such as a polysilicon layer 28 is formed on top of the oxide layer 26. This completes the fabrication of a core unit of a SONOS memory according to a preferred embodiment of the present invention. Next, a spacer (not shown) could be formed on the sidewall of the core unit, and elements such as selective gate, source/drain regions, interlayer dielectric layer, salicides, and contact plugs could be fabricated thereafter according to the demand of the product.

It should be noted that even if a silicon-rich oxide layer 24 and an oxide layer 26 are formed between the nitrogen-containing layer 22 and the polysilicon layer 28, the formation of the oxide layer 26 could also be eliminated depending on the demand of the product. As a result, only a single silicon-rich oxide layer 24 is formed between the nitrogen-containing layer 22 and the polysilicon layer 28. Alternatively, the formation of the silicon-rich oxide layer 24 could be eliminated selectively so that only an oxide layer 26 is formed between the nitrogen-containing layer 22 and the polysilicon layer 28, which is also within the scope of the present invention.

According to other embodiments of the present invention, the process for forming the three material layers containing silicon, including the silicon nitride layer 18, the silicon-rich layer 20, and the nitrogen-containing layer 22 is not limited to the approach disclosed previously, but could also be achieved through ion implants, microwave PECVD, pulse laser, or high energy radiation, which is also within the scope of the present invention.

In addition, all the material layers containing nitrogen as disclosed above, such as the silicon-rich trapping layer 16 and nitrogen-containing layer 22, and/or all the layers from the ONO stacked structure, including oxide layer 14, silicon-rich trapping layer 16, nitrogen-containing layer 22, silicon-rich oxide layer 24, and oxide layer 26 are preferably fabricated in the same chamber tool, but not limited thereto.

Next, metals, composite metals or other materials could also be used to replace the polysilicon layer 28 for forming a memory device of different nature, which is also within the scope of the present invention.

According to the aforementioned fabrication process, a SONOS device is also disclosed, which preferably includes a substrate 12, an oxide layer 14 disposed on the substrate 12, a silicon-rich trapping layer 16 disposed on the oxide layer 14, a nitrogen-containing layer 22 disposed on the silicon-rich trapping layer 16, a silicon-rich oxide layer 24 disposed on the nitrogen-containing layer 22, an oxide layer 26 disposed on the silicon-rich oxide layer 24, and a polysilicon layer 28 disposed on the oxide layer 26.

Preferably, the height of the ONO stacked structure from the SONOS device is between 30-60 Angstroms, in which the thickness of the silicon nitride layer 18 from the silicon-rich trapping layer 16 is preferably less than 10 Angstroms and the thickness of the silicon-rich layer 20 is preferably less than 15 Angstroms. Additionally, the thickness of the nitrogen-containing layer 22 is between 10-30 Angstroms, and the thickness of the silicon-rich oxide layer 24 is less than 15 Angstroms.

According to the aforementioned process and structure, the SONOS device of the present invention includes following features and advantages:

First, two interface layers, including a silicon-rich trapping layer 16 and a silicon-rich oxide layer 24 are preferably added into the ONO stacked structure of a conventional SONOS device. The silicon-rich trapping layer 16 of the present invention, including the two embodiments of a silicon nitride layer and a silicon-rich SiN layer, or a silicon nitride layer and a silicon-rich SiON layer, is preferably used to increase the ability of the device for trapping charges. For instance, the first material layer of the silicon-rich trapping layer 16, such as the silicon nitride layer, is preferably used as a fence to grab onto the charges entering the silicon-rich trapping layer 16 much more easily while preventing leakage of the trapped charges. The second material layer, such as the aforementioned silicon-rich SiN layer or silicon-rich SiON layer of the silicon-rich trapping layer 16 preferably provides more trapping sites while serving as a core layer for trapping charges.

The silicon-rich oxide layer 24 of the present invention also possesses more trapping sites similar to the silicon-rich SiN layer and silicon-rich SiON layer of the silicon-rich trapping layer 16, hence that charges would be trapped more easily as well as released more easily. By placing the silicon-rich oxide layer 24, the charges entering the top portion of the nitrogen-containing layer could be released out of the device much more easily. Overall, by using the aforementioned silicon-rich trapping layer and silicon-rich oxide layer, efficiency of the current SONOS device on trapping charges as well as retaining charges could be improved significantly, and the performance of the device is also increased substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A silicon-oxide-nitride-oxide-silicon (SONOS) device, comprising:
   a substrate;
   a first oxide layer on the substrate;
   a silicon-rich trapping layer on the first oxide layer, wherein the silicon-rich trapping layer comprises a silicon nitride (SiN) layer and a silicon-rich SiN layer;
   a nitrogen-containing layer on the silicon-rich trapping layer;
   a silicon-rich oxide layer on the nitrogen-containing layer; and
   a polysilicon layer on the silicon-rich oxide layer.

2. The SONOS device of claim 1, wherein the thickness of the silicon nitride layer is less than 10 Angstroms and the thickness of the silicon-rich SiN layer is less than 15 Angstroms.

3. The SONOS device of claim 1, wherein the nitrogen-containing layer comprises a silicon nitride layer having a thickness between 10-30 Angstroms.

4. The SONOS device of claim 1, wherein the nitrogen-containing layer comprises a silicon oxynitride layer having a thickness between 10-30 Angstroms.

5. The SONOS device of claim 1, wherein the silicon-rich oxide layer comprises a thickness less than 15 Angstroms.

6. The SONOS device of claim 1, further comprising a second oxide layer between the silicon-rich oxide layer and the polysilicon layer.

7. A silicon-oxide-nitride-oxide-silicon (SONOS) device, comprising:
   a substrate;
   a first oxide layer on the substrate;
   a silicon-rich trapping layer on the first oxide layer, wherein the silicon-rich trapping layer comprises a silicon nitride layer and a silicon-rich SiON layer;
   a nitrogen-containing layer on the silicon-rich trapping layer;
   a silicon-rich oxide layer on the nitrogen-containing layer; and
   a polysilicon layer on the silicon-rich oxide layer.

8. The SONOS device of claim 7, wherein the thickness of the silicon nitride layer is less than 10 Angstroms and the thickness of the silicon-rich SiON layer is less than 15 Angstroms.

* * * * *